United States Patent
Goetz et al.

(10) Patent No.: US 6,376,933 B1
(45) Date of Patent: Apr. 23, 2002

(54) MAGNETO-RESISTIVE SIGNAL ISOLATOR

(75) Inventors: Jay R. Goetz, Deephaven; Hong Wan, Maple Grove, both of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/476,620

(22) Filed: Dec. 31, 1999

(51) Int. Cl.$^7$ .................................................. H05K 9/00
(52) U.S. Cl. ...................... 307/91; 324/117 R; 324/252; 324/207.21; 338/32 R
(58) Field of Search ...................... 307/91; 324/117 R, 324/252, 207.21; 338/32 R

(56) References Cited

U.S. PATENT DOCUMENTS

| | | |
|---|---|---|
| 4,132,864 A | 1/1979 | Feng |
| 4,596,950 A | 6/1986 | Lienhard et al. |
| 4,801,883 A | 1/1989 | Muller et al. ................ 324/252 |
| 4,849,695 A | 7/1989 | Muller et al. ................ 324/252 |
| 5,270,645 A | 12/1993 | Wheeler et al. |
| 5,351,005 A | 9/1994 | Rouse et al. |
| 5,946,394 A | 8/1999 | Gambuzza ................... 379/399 |
| 6,054,780 A | * 4/2000 | Haigh et al. ................... 307/91 |

FOREIGN PATENT DOCUMENTS

| | | |
|---|---|---|
| EP | 0 544 479 A2 | 6/1993 |
| WO | WO 99/21332 | 4/1999 |

OTHER PUBLICATIONS

Honeywell Brochure entitled "Magnetic Sensor Products", dated prior to Dec. 31, 1999.

* cited by examiner

Primary Examiner—Josie Ballato
Assistant Examiner—Robert De Beradinis
(74) Attorney, Agent, or Firm—Dennis C. Bremer

(57) ABSTRACT

Signal isolator circuits using one or more magneto-resistive sensors are disclosed. In a first embodiment, a magneto-resistive sensor is used to sense an input magnetic field. A feedback circuit senses the output signal from the sensor, and applies a current to an output coil that substantially null out the input magnetic field at the magneto-resistive sensor. In another embodiment, the input signal is provided to a first magneto-resistive bridge sensor and an offset input signal is provided to a second magneto-resistive bridge sensor. Changes in sensitivity of the bridge sensors can be detected by comparing the output signal signals from the sensors. The excitation voltage that is applied to the sensors is then adjusted to compensate for any changes in sensitivity. It is contemplated that a single magneto-resistive bridge sensor may be used to effectively perform both measurements of the first and second magneto-resistive bridge sensors.

50 Claims, 12 Drawing Sheets

MAGNETO-RESISTIVE SIGNAL ISOLATOR

BACKGROUND OF THE INVENTION

This invention relates to the field of signal isolators, and more particularly, to signal isolators that use magnetic fields to provide electrical isolation between first and second electrical signals.

Many electronic applications require some form of signal isolation. Some of these applications include, for example, industrial control applications, down-hole petroleum and geothermal applications, certain medical applications, and numerous other applications. Signal isolators can be used, for example, to couple signals that have relatively large offsets in DC voltage levels, to prevent ground loops for reducing system noise, etc.

One approach for providing signal isolation is through the use of one or more opto-couplers. Opto-couplers use light to couple two electrically isolated circuits. One opto-coupler approach is shown in U.S. Pat. No. 5,946,394 to Gambuzza. A limitation of using opto-couplers is that special hybrid fabrication techniques are often required, which can increase the cost of such devices.

Another approach for providing signal isolation is through the use of one or more Carrier-Domain-Magnometers (CDMs). In this approach, a magnetic field is used to couple two electrically isolated circuits. U.S. Pat. No. 4,849,695 to Muller et al. and U.S. Pat. No. 4,801,883 to Muller et al. each show a signal isolator that uses one or more Carrier-Domain-Magnometers (CDMs). CDMs are typically npnp or pnpn devices that are manufactured directly into the substrate of an integrated circuit. A limitation of many CDMs is that they often consume significant real estate, draw significant power, have limited sensitivity, and may be relatively slow.

SUMMARY OF THE INVENTION

The present invention overcomes many of the disadvantages of the prior art by providing a signal isolator that uses one or more magneto-resistive magnetic field sensors. Magneto-resistive magnetic field sensors may be less expensive to manufacture than opto-couplers, and may consume less real estate (particularly since they can often be stacked above electronic circuitry), draw less power, have higher sensitivity and may be faster than CDM based sensors.

In a first illustrative embodiment of the present invention, a signal isolator is provided that has an input coil, a magneto-resistive magnetic field sensor, an output or feedback coil, and a feedback circuit. The input coil receives an input signal and generates a corresponding input magnetic field at the magneto-resistive magnetic field sensor. The magneto-resistive magnetic field sensor senses the input magnetic field and provides a corresponding output signal. The feedback circuit receives the output signal from the magneto-resistive magnetic field sensor, and provides a feedback signal to the output coil such that the output coil generates an output magnetic field that at least substantially nulls out the input magnetic field. An isolated output signal that is related to the input signal can then be derived from the feedback signal.

An advantage of this configuration is that the transfer characteristics of the signal isolator are relatively independent of the sensitivity of the magneto-resistive magnetic field sensor. It is known that the sensitivity of magneto-resistive magnetic field sensors often depends on a number of factors including, for example, temperature, voltage, or just the mere passage of time (drift). However, because the changes in sensitivity of the magneto-resistive magnetic field sensor are experienced equally by the transduced input and output (feedback) magnetic fields (i.e., common mode), the signal isolator may be relatively insensitive to such sensitivity changes. Accordingly, it is contemplated that the illustrative signal isolator may be used in relatively harsh environments such as high temperature environments where sensitivity of the basic sensor changes significantly, high radiation environments where devices using semiconductor junctions are damaged by high energy particles, etc.

In another illustrative signal isolator of the present invention, two magneto-resistive bridge sensors are used, each operating at a different characteristic point along the applied field versus output voltage curve (e.g., two different input magnetic fields produce two different output signals). By using such a configuration, changes in the sensitivity of the bridge sensors can be detected. Once detected, the excitation voltage that is applied to the bridge sensors can be adjusted to compensate for any changes in sensitivity by maintaining a predetermined offset between the two signals, such as a constant value.

In another illustrative embodiment, only a single magneto-resistive bridge sensor is used to sequentially perform both measurements of the first and second magneto-resistive bridge sensors of the previous illustrative embodiment. In this embodiment, the input signal is provided to an input coil, and the resulting magnetic field is sensed by the magneto-resistive bridge sensor to provide a first output signal, which is subsequently stored. Thereafter, a bias signal (e.g., bias current) is added to the input signal to provide an offset input signal. The offset input signal is then provided to the input coil. The magneto-resistive bridge sensor then senses the resulting input magnetic field and provides a second output signal. The second output signal can be stored, or alternatively, directly compared to the first output signal. A compensation circuit then updates the excitation voltage that is provided to the magneto-resistive bridge sensor so that the difference between the first output signal and the second output signal remains at a predetermined value, such as a constant value.

In another illustrative embodiment, an AC source is provided for modulating either the input signal itself or the input magnetic field. The magneto-resistive bridge sensor senses the modulated magnetic field, and provides a modulated output signal. The modulated output signal is provided to a filter, which filters out the higher frequency modulation component provided by the AC source and leaves the lower frequency component provided by the input signal.

To provide compensation, a peak-to-peak detector 524 detects the peak-to-peak voltage of the modulated output signal of the magneto-resistive bridge sensor. The peak-to-peak voltage is compared to a predetermined reference, and the bridge excitation voltage is adjusted until the peak-to-peak voltage equals the predetermined reference voltage 526.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
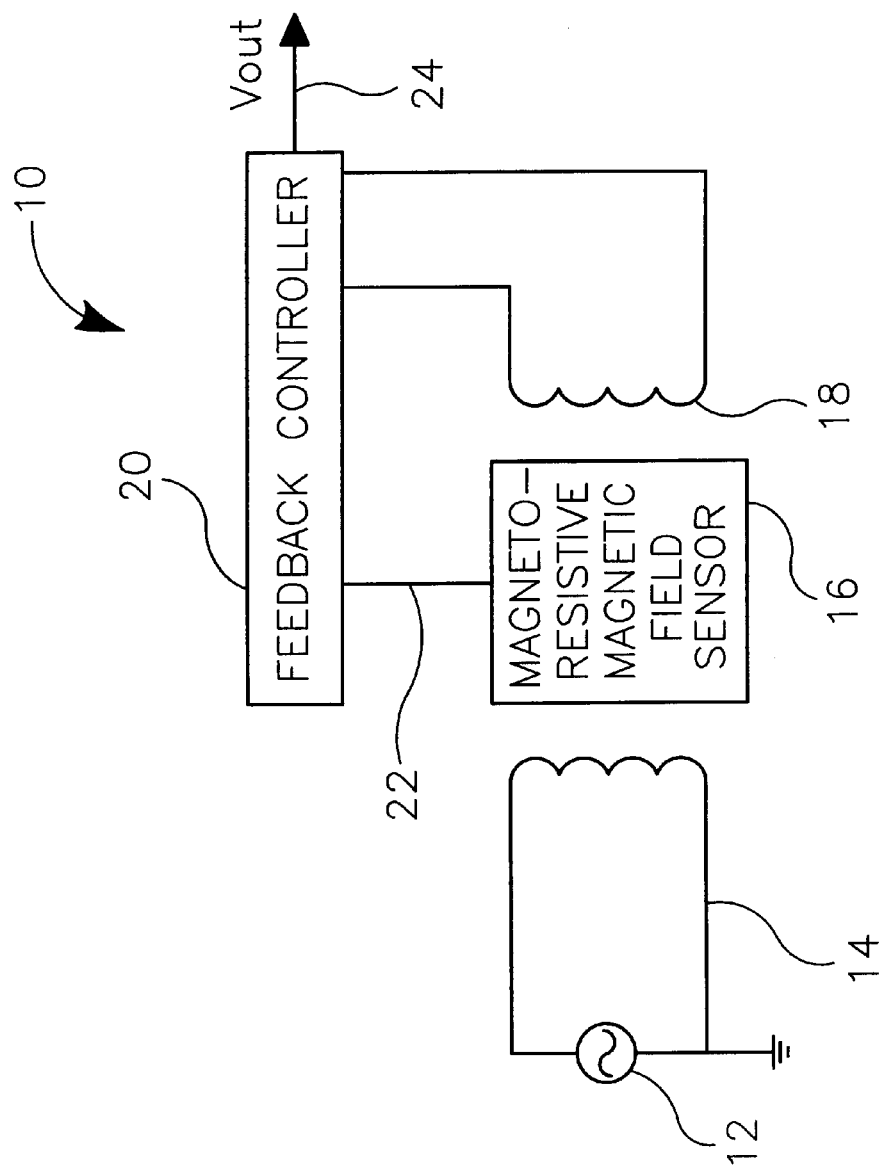
FIG. 1 is a block diagram of a first illustrative embodiment of the present invention.

FIG. 1 is a block diagram of a first illustrative signal isolator of the present invention. The signal isolator is generally shown at 10, and includes an input signal source 12, an input coil 14, a magneto-resistive magnetic field sensor 16, an output or feedback coil 18, and a feedback controller 20. The input signal source 12 supplies an input signal to the input coil 14, which generates an input magnetic field. The input coil is positioned adjacent the magneto-resistive magnetic field sensor 16. The magneto-resistive magnetic field sensor 16 senses the input magnetic field and provides an output signal 22 to the feedback controller 20.

The feedback controller 20 receives the output signal 22 from the magneto-resistive magnetic field sensor 16, and provides a feedback signal to the output coil 18. The feedback signal preferably causes the output coil 18 to generate an output magnetic field that at least substantially nulls out the input magnetic field at the magneto-resistive magnetic field sensor 16. Accordingly, the feedback controller 20 strives to keep the output signal 22 provided by the magneto-resistive magnetic field sensor 16 at or near zero. An isolated output signal 24 is derived from the feedback signal.

An advantage of using the output coil 18 to null out the input magnetic field is that the transfer characteristics of the signal isolator 10 may be relatively independent of the sensitivity of the magneto-resistive magnetic field sensor 16. As indicated above, it is known that the sensitivity of magneto-resistive magnetic field sensor 16 may be dependent on a number of factors including, for example, changes in temperature, changes in voltage, or just the mere passage of time (aging). However, and in accordance with the present invention, because the changes in sensitivity of the magneto-resistive magnetic field sensor 16 are experienced equally by the input magnetic field and output magnetic field (i.e., common mode), the signal isolator 10 may be relatively insensitive to such sensitivity changes. Accordingly, the signal isolator 10 may be used in relatively harsh environments such as high temperature environments, high radiation environments, etc.

Figure 2:
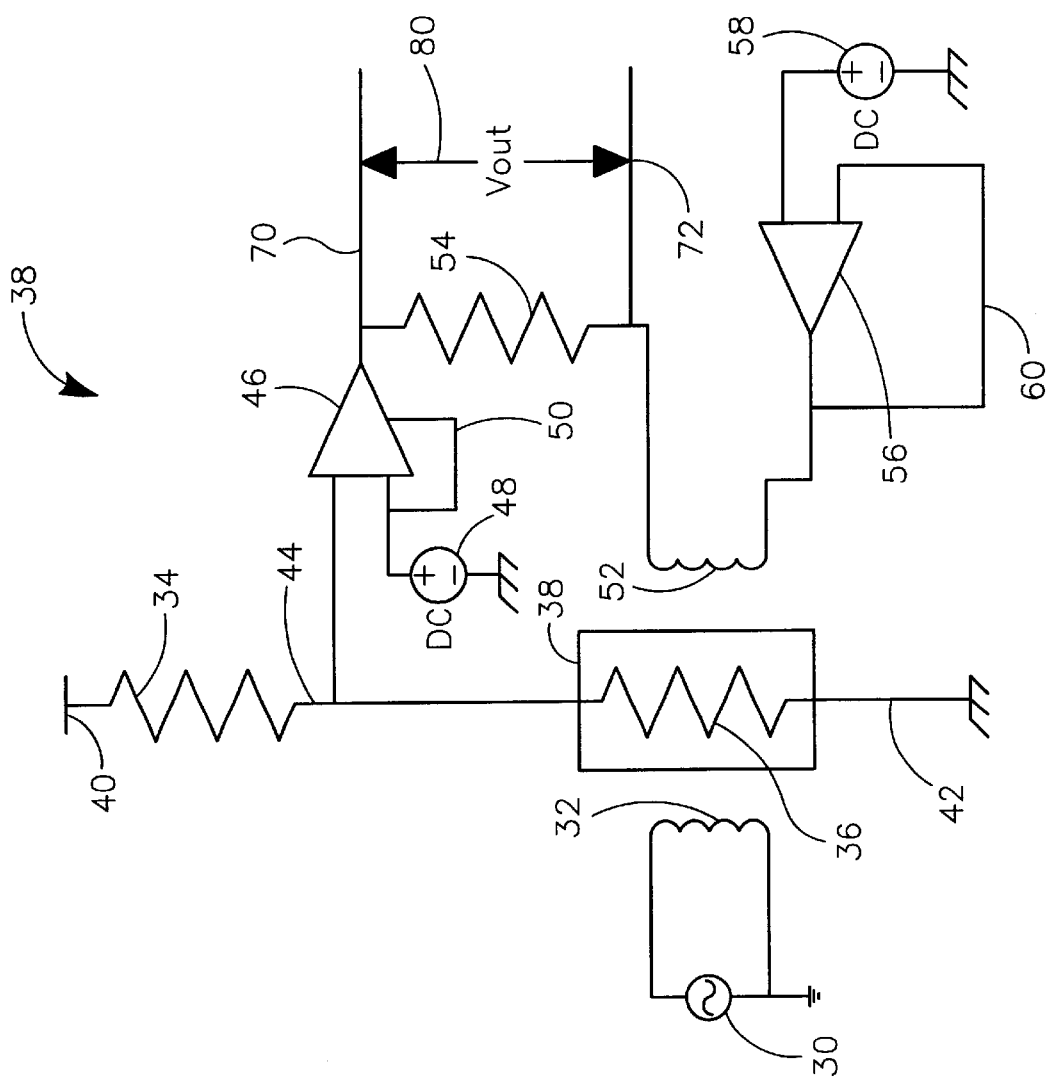
FIG. 2 is a schematic view of another illustrative embodiment of the present invention including a half bridge magneto-resistive magnetic field sensor.

FIG. 2 is a schematic view of another illustrative signal isolator of the present invention. The signal isolator is generally shown at 38, and includes an input signal source 30, an input coil 32, a half-bridge magneto-resistive magnetic field sensor, an output or feedback coil 52, and feedback control circuitry. The input signal source 30 supplies an input signal to the input coil 32, which generates an input magnetic field.

The half-bridge magneto-resistive magnetic field sensor includes a first resistive element 34 and a second resistive element 36. In the embodiment shown, only the second resistive element 34 is a magneto-resistive element, as indicated by box 38. The magneto-resistive element may be formed from any type of magneto-resistive sensor including magneto-resistive sensors having materials or structures such as AMR, GMR, CMR, etc. The first resistive element 34 and a second resistive element 36 are connected in series between a supply or excitation voltage 40 and ground 42. The sensor output signal of the half-bridge magneto-resistive magnetic field sensor is taken from the connection point 44 between the first resistive element 34 and the second resistive element 36. Thus, in this embodiment, the first resistive element 34 and a second resistive element 36 act as a voltage divider.

Differential amplifier 46 has one input coupled to the sensor output signal 44, and the other input coupled to a reference voltage provided by DC supply 48. Preferably, the reference voltage is set to the expected voltage of the sensor output 44 when no field is applied to the magneto-resistive element 36. The differential amplifier 46 also preferably has a bias input terminal 50 for accepting a bias voltage. The differential amplifier 46 preferably provides an output voltage on node 70 that equals the bias voltage when the sensor output 44 is equal to the reference voltage provided by DC supply 48.

The resistance of the magneto-resistive element 36 changes in response to the input magnetic field. This resistance change causes the sensor output signal 44 to also change. As the sensor output signal 44 diverges from the reference voltage provided by DC supply 48, the differential amplifier 46 begins to provide more current to output voltage node 70.

The output voltage node 70 is connected to a first end of the output or feedback coil 52 through resistor 54. The other end of output or feedback coil 52 is connected to a constant voltage supply, which is preferably at the same voltage that is supplied by differential amplifier 46 when no input magnetic field is applied to magneto-resistive element 36. In this configuration, no current flows through output coil 52 or resistor 54 when no input field is applied to magneto-resistive element 36. As such, the isolated output voltage of the sensor, when taken across resistor 54, is also zero. The constant voltage supply may be provided by differential amplifier 56, with one input connected to a DC supply 58 and the other input coupled to the differential amplifier output, as shown.

When an input magnetic field is applied to magneto-resistive element 36, the differential amplifier 46 begins to either source or sink current through output coil 52 and resistor 54. This current causes the output coil 52 to produce an output magnetic field adjacent the magneto-resistive element 36. The differential amplifier 46 preferably sources or sinks sufficient current to cause the output coil 52 to cancel out substantially all of the input magnetic field produced by the input coil 32. The magnitude of the current that is either sourced or sunk by differential amplifier 46 can be measured across resistor 54, and provided as an isolated output signal 80.

An advantage of this configuration is that the transfer characteristics of the signal isolator 38 may be relatively independent of the sensitivity of the magneto-resistive magnetic field sensor. It is known that the sensitivity of magneto-resistive magnetic field sensors may be dependent on a number of factors including, for example, changes in temperature, changes in voltage, or just the mere passage of time (aging). However, because the changes in sensitivity of the magneto-resistive magnetic field sensor are experienced equally by the transduced input and output magnetic fields (i.e., common mode), the signal isolator 38 may be relatively insensitive to such sensitivity changes. Accordingly, it is believed that the illustrative signal isolator may be used in relatively harsh environments such as high temperature environments wherein the sensitivity of the sensor element can change significantly, high radiation environments where semiconductor based devices can become damaged by high energy particles, etc.

Figure 3:
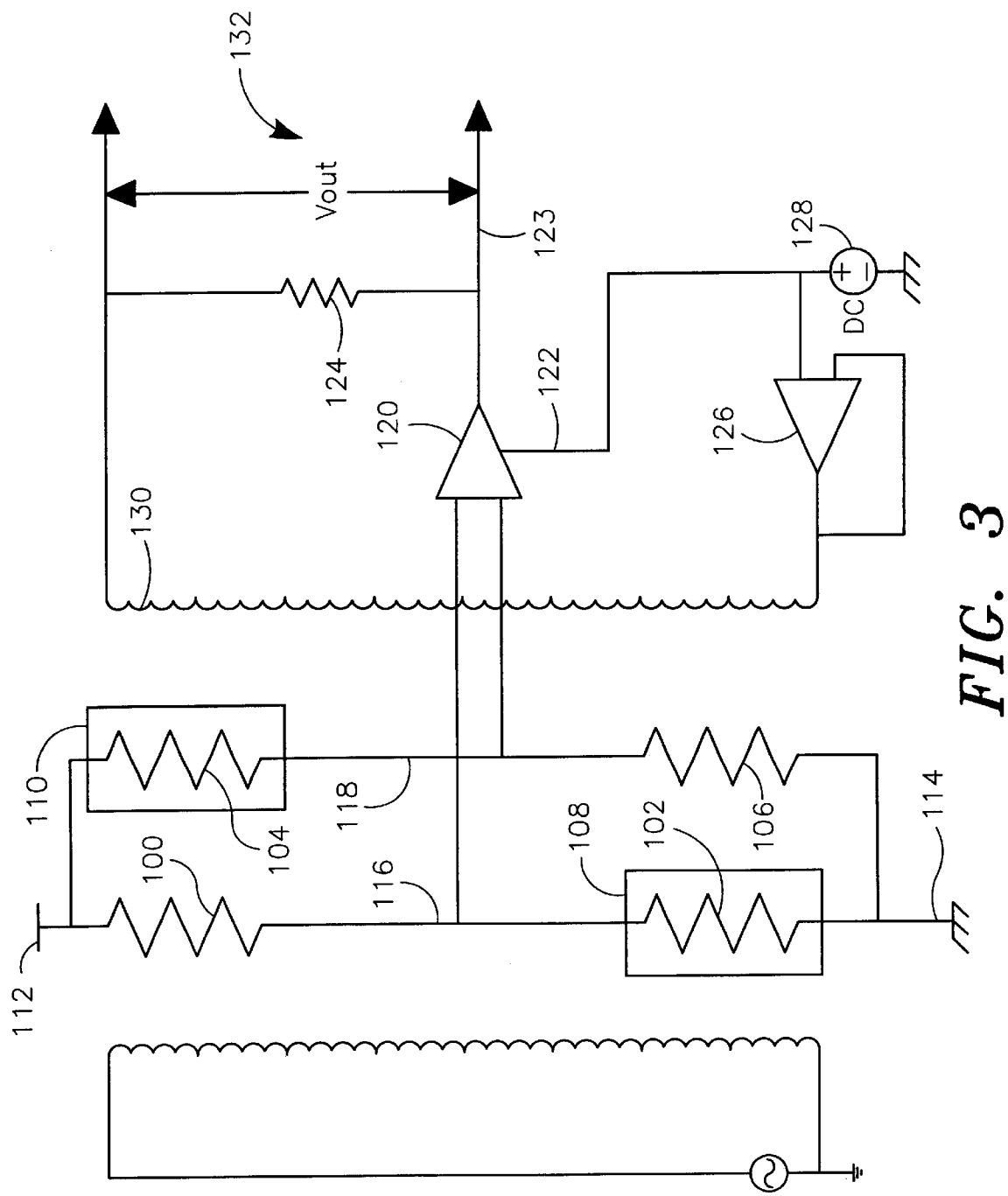
FIG. 3 is a schematic view of yet another illustrative embodiment of the present invention including a full bridge magneto-resistive magnetic field sensor having two magneto-resistive elements.

FIG. 3 is a schematic view of yet another illustrative embodiment of the present invention. This embodiment is similar to the half bridge embodiment of FIG. 2, but includes a full bridge magneto-resistive magnetic field sensor. The magneto-resistive magnetic field sensor includes a first resistive element 100, a second resistive element 102, a third resistive element 104 and a fourth resistive element 106. In the embodiment shown, only the second resistive element 102 and the third resistive element 104 are magneto-resistive elements, as indicated by boxes 108 and 110, respectively. The magneto-resistive elements may be formed from any type of magneto-resistive material or structure including, for example, AMR, GMR, CMR, etc.

The first resistive element 100 and the second resistive element 102 are connected in series between a supply or excitation voltage 112 and ground 114. Likewise, the third resistive element 106 and a fourth resistive element 108 are connected in series between excitation voltage 112 and ground 114. The sensor output signal of the full-bridge magneto-resistive magnetic field sensor is preferably taken between connection points 116 and 118, as shown.

A differential amplifier 120 is provided for comparing the differential signal between connection points 116 and 118. The differential amplifier 120 also preferably has a bias input terminal 122 for accepting a bias voltage. The bias voltage causes the different amplifier 120 to provide an output voltage on node 123 that equals the bias voltage when the voltages on connection points 116 and 118 are equal (i.e., no input magnetic field).

The resistance of the magneto-resistive elements 102 and 104 change in response to an input magnetic field. Preferably, magneto-resistive elements 102 and 104 change in the same direction in response to the input magnetic field. This resistance change causes the differential sensor output signal between connection points 116 and 118 to change. The full bridge configuration of FIG. 3 provides about twice the signal level of the half-bridge configuration of FIG. 2.

As the differential sensor output signal between connection points 116 and 118 increases, the differential amplifier 120 begins to provide more current to output voltage node 123. The output voltage node 123 is connected to a first end of the output or feedback coil 130 through resistor 124. The other end of the output or feedback coil 130 is connected to a constant voltage supply, which is preferably at the same voltage that is supplied by differential amplifier 120 when no input magnetic field is applied to magneto-resistive elements 102 and 104. As such, no current flows through output coil 130 or resistor 124 when no input field is applied to magneto-resistive elements 102 and 104. Accordingly, the isolated output voltage of the sensor, when taken across resistor 124, is also zero. The constant voltage supply may be provided by differential amplifier 126, with one input connected to a DC supply 128 and the other input coupled to the differential amplifier output, as shown.

When an input magnetic field is applied to magneto-resistive elements 102 and 104, the differential amplifier 120 begins to either source or sink current through output coil 130 and resistor 124. The differential amplifier 120 preferably sources or sinks sufficient current to cause the output coil 130 to substantially cancel out all of the input magnetic field produced by the input coil. The magnitude of the current that is either sourced or sunk by differential amplifier 120 can be measured across resistor 124 and preferably corresponds to an isolated output signal 132.

Figure 4:
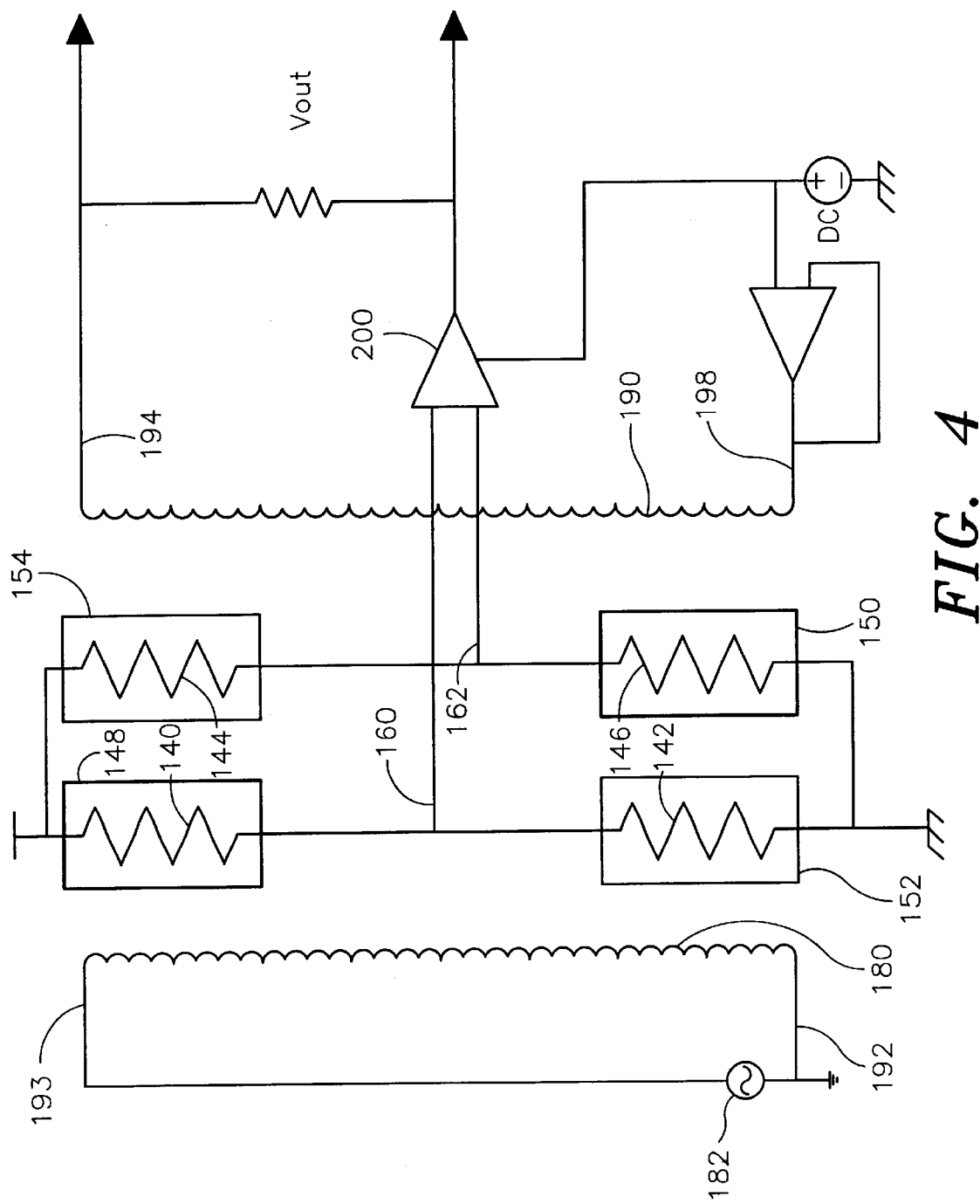
FIG. 4 is a schematic view of another illustrative embodiment of the present invention including a full bridge magneto-resistive magnetic field sensor having four magneto-resistive elements.

FIG. 4 is a schematic view of another illustrative embodiment of the present invention. This embodiment is similar to that shown in FIG. 3, but includes four magneto-resistive elements rather than just two. The magneto-resistive magnetic field sensor includes a first magneto-resistive element 140, a second magneto-resistive element 142, a third magneto-resistive element 144 and a fourth magneto-resistive element 146. In the embodiment shown, the resistance of the first magneto-resistive element 140 and the fourth magneto-resistive element 146 change in one direction in response to an input magnetic field, as indicated by darkened boxes 148 and 150, respectively. The resistance of the second magneto-resistive element 142 and the third magneto-resistive element 144 change in an opposite direction in response to the input magnetic field, as indicated by lighter boxes 152 and 154, respectively. The sensor output signal of the magneto-resistive magnetic field sensor is again taken between connection points 160 and 162, as shown. This configuration provides even more signal level than the full-bridge configuration of FIG. 3.

As shown and described with reference to FIG. 2, an input signal source 182 provides an input signal to an input coil 180, which generates an input magnetic field at the magneto-resistive elements. The input coil 180 has a first end 193s and a second end 192. Likewise, an output or feedback coil 190 is controlled by differential amplifier 200. The output or feedback coil 190 also has a first end 194 and a second end 196.

Figure 5:
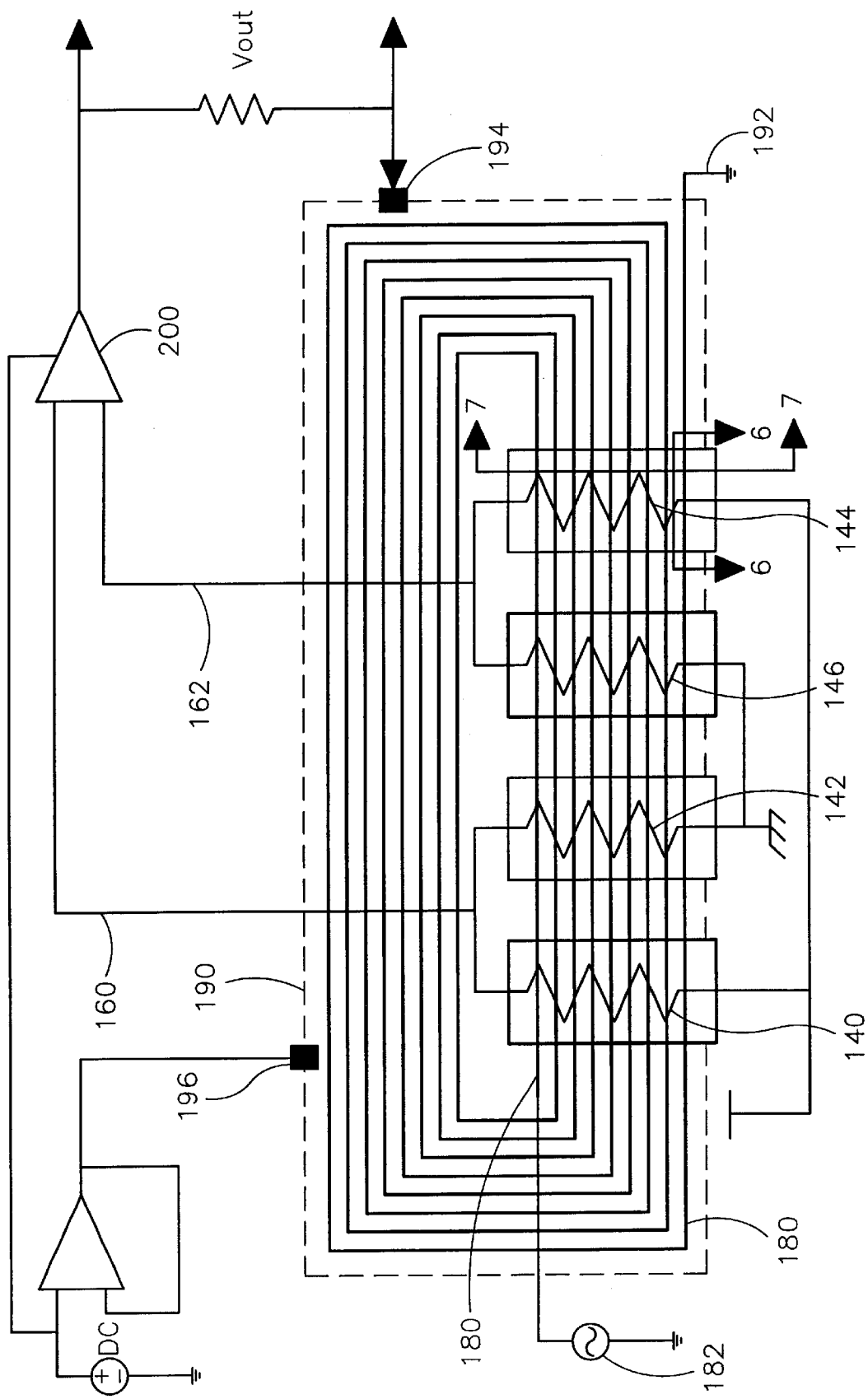
FIG. 5 is a diagram of the illustrative embodiment of FIG. 4 showing an illustrative layout for the input and output coils.

FIG. 5 is a diagram of the illustrative embodiment of FIG. 4 showing an illustrative layout for the input coil 180 and the output coil 190. Preferably, the input coil 180 is provided along a first surface of the magneto-resistive elements 140, 142, 144 and 146 of the sensor bridge, and is separated therefrom by a first dielectric or isolation layer. In the illustrative embodiment, the input coil 180 is provided over the top of magneto-resistive elements 140, 142, 144 and 146. While the input coil 180 is shown in a coil configuration, it is contemplated that the input coil 180 may be provided in any number of configurations including a serpentine strip configuration.

The output coil 190 is preferably provided along a second opposite surface of the same magneto-resistive elements, and separated therefrom by a second dielectric or isolation layer. In the illustrative embodiment, the output coil 190 is provided beneath the magneto-resistive elements 140, 142, 144 and 146, and is generally indicated by dashed line 190. The output coil 190 is accessed at points 194 and 196. The input coil 180 and the output coil 190 preferably have the same structure so that by applying an appropriate current to the input and output coils, the magnetic field at the magneto-resistive elements 140, 142, 144 and 146 can be effectively canceled.

While the input coil 180 and the output coil 190 are shown on opposite sides of the magneto-resistive elements 140, 142, 144 and 146, it is contemplated that both coils may be on the same side of the magneto-resistive elements 140, 142, 144 and 146, if desired. The direction of the current provided to the input coil 180 and output coil 190 can be adjusted accordingly.

Figure 6:
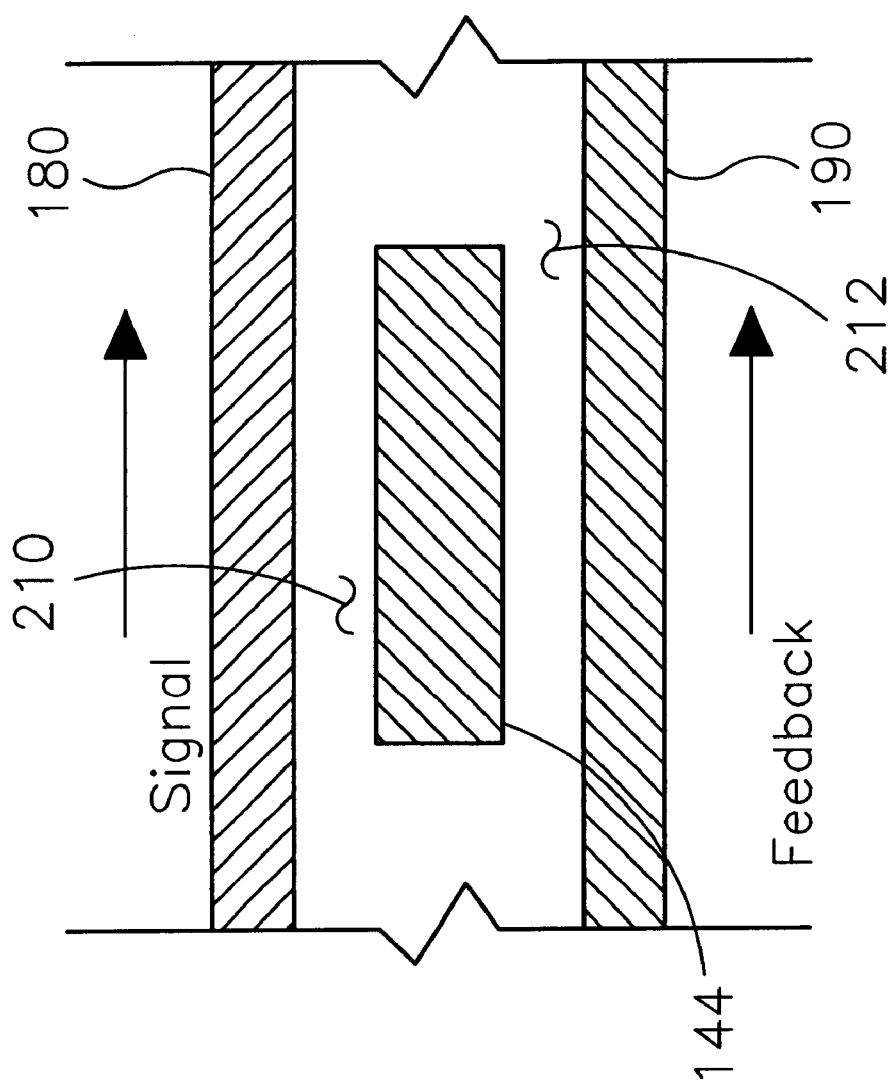
FIG. 6 is a partial cross-sectional view of the embodiment shown in FIG. 5 taken along line 6—6.

FIG. 6 is a partial cross-sectional view of the embodiment shown in FIG. 5 taken along line 6—6. The input coil 180 is shown above magneto-resistive element 144, and separated therefrom by dielectric or insulating layer 210. The output coil is shown below magneto-resistive element 144, and separated therefrom by dielectric or insulating layer 212. The current in the input coil 180 is shown passing from left to right, and the current in the output coil 190 is shown passing from left to right. The current in the input coil 180 generates a magnetic field that extends into the page at the magneto-resistive bit 144, and the current in the output coil 190 generates a magnetic field that extends out of the page at the magneto-resistive bit 144. Thus, by providing an appropriate current to the output coil 190, the input magnetic field at the magneto-resistive bit 144 may be effectively canceled.

It is contemplated that the thickness of the dielectric or isolating layers 210 and 212 may be selected to accommodate different expected potentials at each of the coils. For example, the input coil 180 may be expected to carry hundreds or even thousands of volts, while the output coil 190 may only be expected to carry less than tens of volts. In this instance, the thickness of the first insulation layer 210 may be thickened relative to the second insulation layer 212 to prevent breakdown and/or damage to the sensor. Likewise, the coil constants may be controlled by using different numbers of metal traces when forming the input and output coils. Different coil constants can provide different transformer characteristics.

Figure 7:
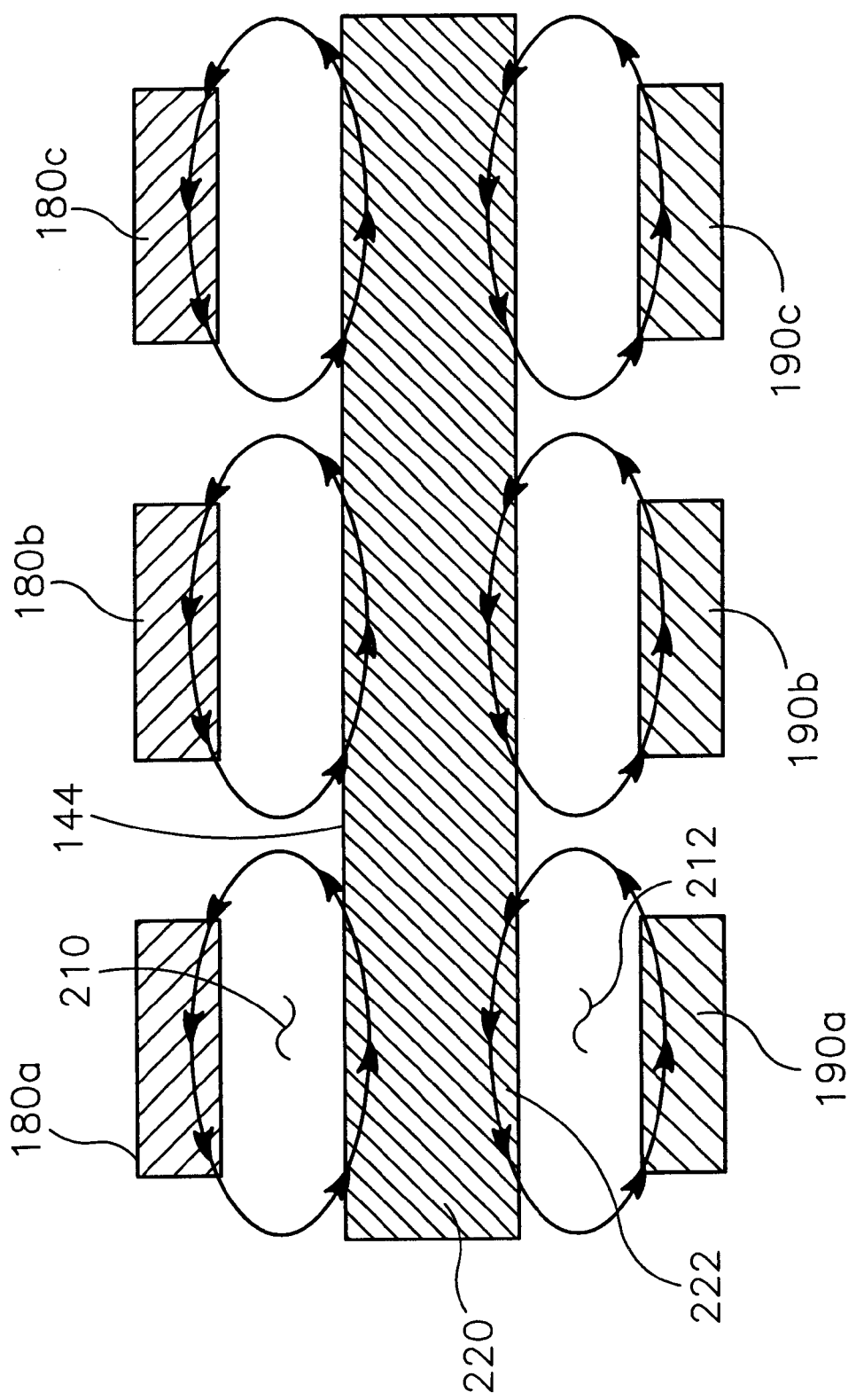
FIG. 7 is a partial cross-sectional view of the embodiment shown in FIG. 5 taken along line 7—7.

FIG. 7 is a partial cross-sectional view of the embodiment shown in FIG. 5 taken along line 7—7. The input coil 180 is shown above magneto-resistive element 144, and separated therefrom by dielectric or insulating layer 210. The output coil 190 is shown below magneto-resistive element 144, and separated therefrom by dielectric or insulating layer 212. A number of turns for the input coil 180 are shown at 180a, 180b and 180c, and a number of turns for the output coil 190 are shown at 190a, 190b and 190c. The currents in the input coil turns 180a, 180b and 180c and the output coil turns 190a, 190b and 190c are assumed to be coming out of the page. The current in the input coil turns 180a, 180b and 180c generates a magnetic field that extends to the right at the magneto-resistive bit 144, and shown at 220. Conversely, the current in the output coil turns 190a, 190b and 190c generates a magnetic field that extends to the left at the magneto-resistive bit 144 as shown at 222. Accordingly, by providing an appropriate current to the output coil turns 190a, 190b, and 190c, the input magnetic field at the magneto-resistive bit 144 may be effectively canceled.

Figure 8:
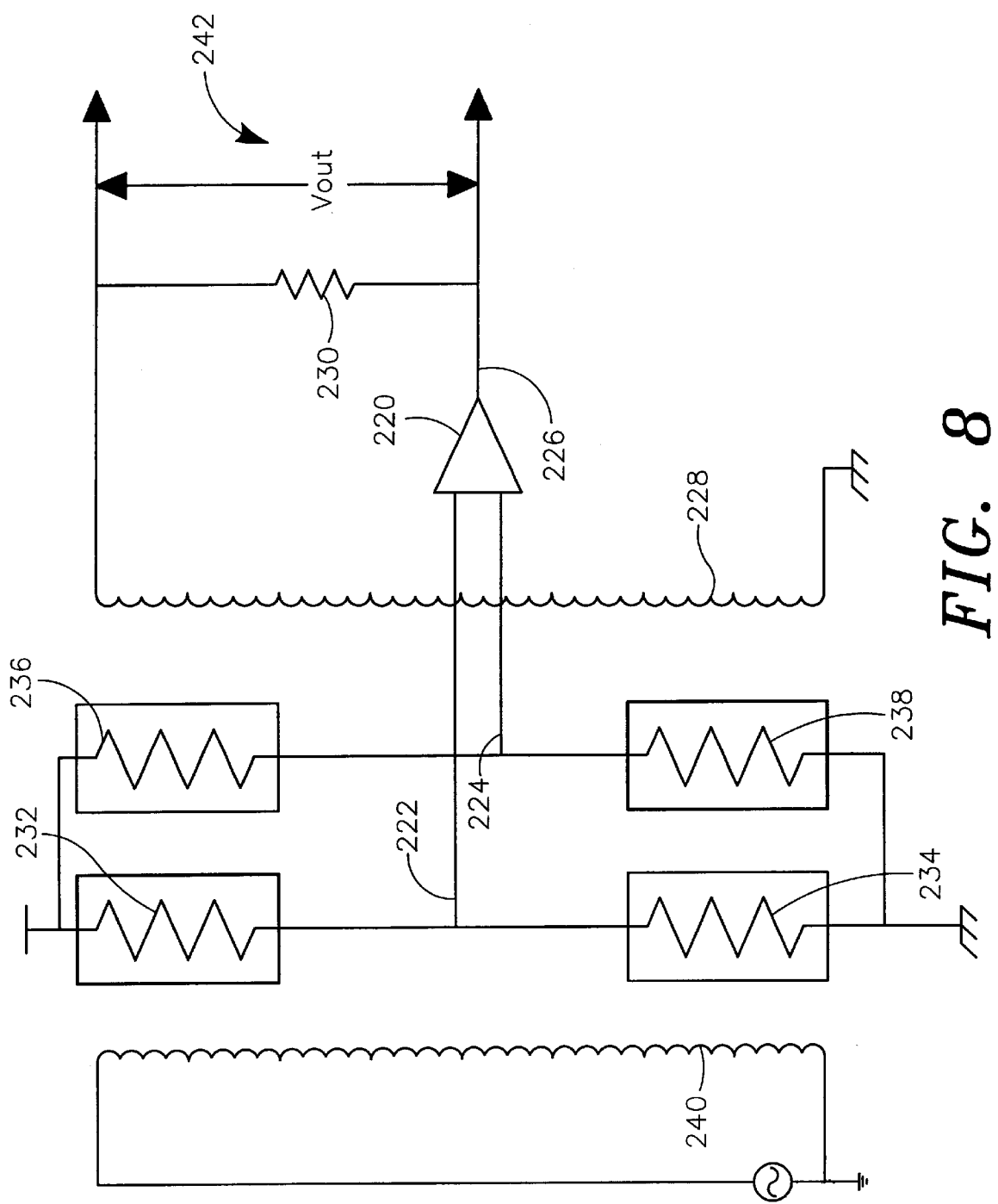
FIG. 8 is a schematic view of yet another illustrative embodiment of the present invention including a full bridge magneto-resistive magnetic field sensor.

FIG. 8 is a schematic view of yet another illustrative embodiment of the present invention including a full bridge magneto-resistive magnetic field sensor. This embodiment is similar to FIG. 4, but one end of the output coil is coupled to ground.

A differential amplifier 220 is provided for comparing the differential signal provided by the sensor bridge between connection points 222 and 224, as shown. In this embodiment, the differential amplifier 220 preferably provides an output voltage on node 226 that is at ground when the voltages on connection points 222 and 224 are equal (i.e., no input magnetic field).

As the differential sensor output signal between connection points 222 and 224 increases due to an increasing input magnetic field, the differential amplifier 220 begins to provide more current to output voltage node 226. The output voltage node 226 is connected to a first end of the output or feedback coil 228 through resistor 230. The other end of the output or feedback coil 228 is connected to ground, which is preferably the same voltage that is supplied by differential amplifier 220 when no input magnetic field is applied. As such, no current flows through output coil 228 or resistor 230 when no input magnetic field is applied. Accordingly, the isolated output voltage of the sensor, when taken across resistor 230, is also zero.

When an input magnetic field is applied to magneto-resistive elements 232, 234, 236 and 238, the differential amplifier 220 begins to either source or sink current through output coil 228 and resistor 230. Preferably, the differential amplifier 220 sources or sinks sufficient current to cause the output coil 228 to cancel out substantially all of the input magnetic field produced by the input coil 240. The magnitude of the current that is either sourced or sunk by differential amplifier 220 can be measured across resistor 230, and provided as an isolated output signal 242.

Figure 9:
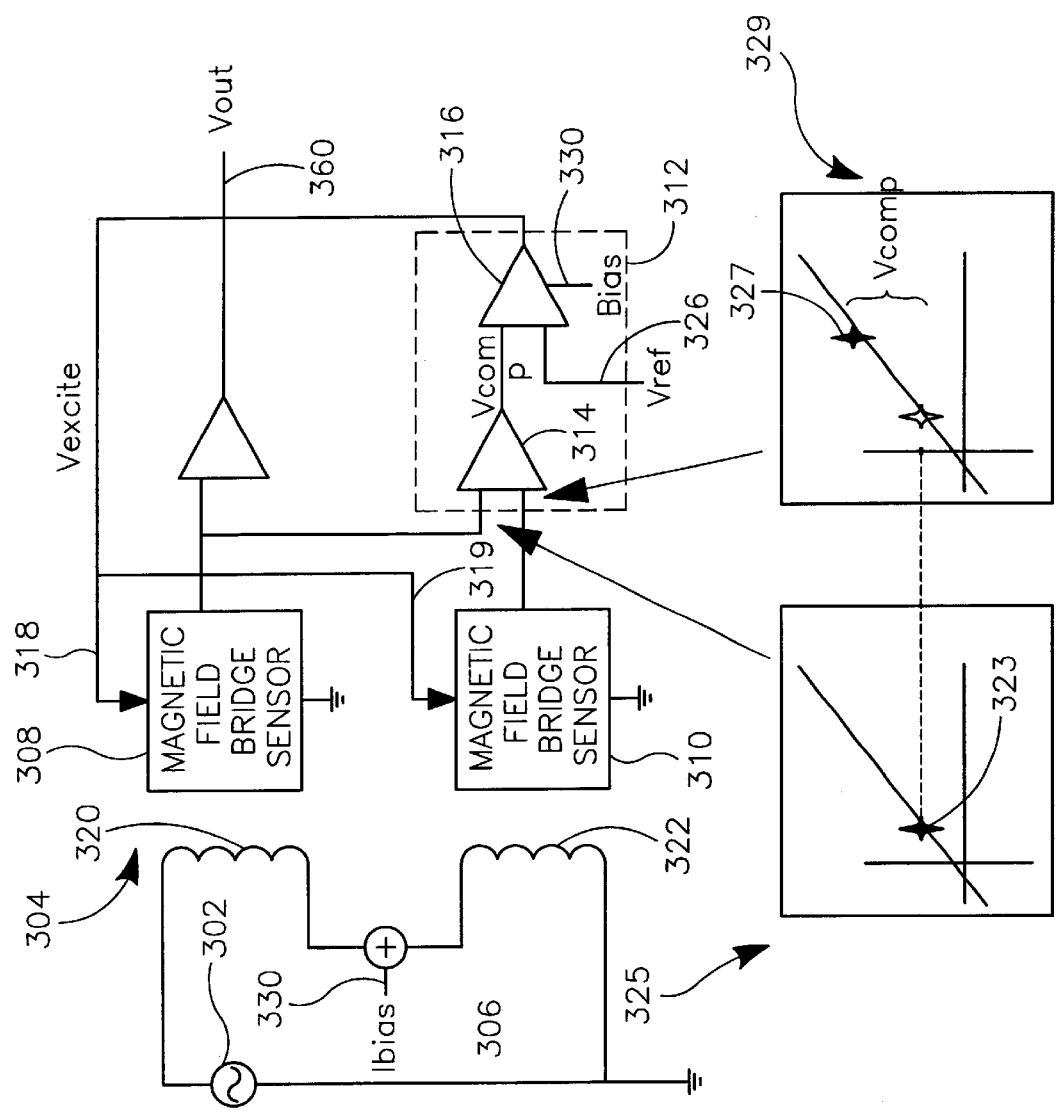
FIG. 9 is a schematic view of another illustrative embodiment of the present invention including two magneto-resistive bridge sensors, each operating at different characteristic points along an applied field versus output voltage curve.

FIG. 9 is a schematic view of another illustrative embodiment of the present invention. This embodiment includes two magneto-resistive magnetic field sensors 308 and 310, each operating at different characteristic points along an applied field versus output voltage curve. In a preferred embodiment, the two magneto-resistive magnetic field sensors 308 and 310 have an identical structure. By operating the magneto-resistive magnetic field sensors at different characteristic points along the applied field versus output voltage curve, sensitivity changes in the bridge sensors can be detected. Once detected, the excitation voltage that is applied to the bridge sensors 308 and 310 can be adjusted to compensate for the change in sensitivity. Accordingly, the illustrative signal isolator may be relatively insensitive to common mode changes in sensitivity of the bridge sensors 308 and 310, and thus may be used in relatively harsh environments such as high temperature environments, high radiation environments, etc. It is believed that this embodiment may also require less power than the embodiments shown in FIGS. 1–8, because no output magnetic field is to generated to cancel or null out the input magnetic field.

An illustrative signal isolator is generally shown at 298, and may include an input signal source 302, an input coil 304, a first magneto-resistive bridge sensor 308, a second magneto-resistive bridge sensor 310, and a compensation circuit 312. The input coil 304 preferably is divided into two parts including a first part 320 and a second part 322. The first part 320 of the input coil 304 extends adjacent the first magneto-resistive bridge sensor 308, and the second part 322 of the input coil 304 extends adjacent the second magneto-resistive bridge sensor 310. The first part 320 of the input coil 304 receives an input signal from the input signal source 302, and generates a first input magnetic field adjacent the first magneto-resistive bridge sensor 308. The second part 322 of the input coil 304 receives an offset input signal, which is preferably generated by adding an offset signal 330 to the input signal, as shown. The second part 322 of the input coil 304 thus generates a second input magnetic field that is offset from the first input magnetic field adjacent the second magneto-resistive bridge sensor 310.

Because different magnetic fields are applied to the first and second magneto-resistive bridge sensors 308 and 310, the first magneto-resistive bridge sensor 308 operates at a first point 323 on the applied field versus output voltage curve as shown in graph 325, and the second magneto-resistive bridge sensor 310 operates at a second point 327 on the applied field versus output voltage curve as shown in graph 329.

The compensating circuit 312 is preferably coupled to the output terminals of the first and second magneto-resistive bridge sensors 308 and 310. The compensating circuit 312 preferably provides a compensated excitation voltage to the excitation voltage terminals 318 and 319 of the first and second magneto-resistive bridge sensors 308 and 310, respectively. The compensated excitation voltage is a function of the difference between the output voltages of the first and second magneto-resistive bridge sensors 308 and 310. In a preferred embodiment, the compensating circuit 312 adjusts the compensated excitation voltage that is provided to the first and second magneto-resistive bridge sensors 308 and 310 so that the difference between the output voltage of the first magneto-resistive bridge sensor 308 and the output voltage of the second magneto-resistive bridge sensor 310 remains at a constant value.

In the illustrative embodiment, the compensating circuit 312 includes a first differential amplifier 314 and a second differential amplifier 316. The first differential amplifier 314 receives the output voltage signals from the first and second magneto-resistive bridge sensors 308 and 310, and provides a compare voltage (Vcomp) that is related to the difference of the output voltages. The second differential amplifier 316 compares the Vcomp voltage with a predetermined reference voltage 326. The predetermined reference voltage 326 is preferably set to the expected Vcomp under a set of predetermined conditions, such as for example, when no input magnetic field is applied, at a predetermined temperature, and with a given bridge excitation voltage. The second differential amplifier 316 is also preferably biased with a bias voltage 330, which causes the second differential amplifier 316 to provide a bridge excitation voltage to the first and second magneto-resistive bridge sensors 308 and 310 that corresponds to the predetermined bridge excitation voltage that was used when determining the predetermined reference voltage 326.

The sensitivity of magneto-resistive bridge sensors 308 and 310 may be dependent on a number of factors including, for example, changes in temperature, changes in voltage, or just the mere passage of time (aging). For a typical magneto-resistive bridge sensor, the output voltage is related to the input or applied magnetic field by:

$$V_{out} = V_{ex} \times S \times A \times I_F \quad (1)$$

Where, $V_{ex}$ is the voltage applied to the sensor bridge;

S is the sensitivity of the bridge; and $A \times 1_F$ is the input or applied magnetic field expresses as a proportionality constant A which is a function of the coil cross-sectional area and the coil-to-sensor spacing, and $I_F$ which is the coil current. As can be seen, the sensitivity of the magneto-resistive bridge sensors may directly effect the output voltage that is produced for a given input or applied magnetic field. Also, the reference voltage $V_{ex}$ may directly effect the output voltage that is produced for a given input or applied magnetic field. Accordingly, the present invention contemplates minimizing or canceling any changes in sensitivity of the bridge sensors 308 and 310 by providing a corresponding and opposite change in the excitation voltage that is applied to the bridge sensors.

Referring specifically to FIG. 9, any changes in the sensitivity of the first and second magneto-resistive bridge sensors 308 and 310 may cause the difference between the output voltages of the first and second magneto-resistive bridge sensors 308 and 310 to change. In response, the first differential amplifier 314 may produce a change in the Vcomp voltage that is provided to the second differential amplifier 316. The second differential amplifier 316 then compares the Vcomp voltage to the predetermined reference voltage 326, and adjusts the bridge excitation voltage that is supplied to the excitation voltage terminals 318 and 319 of the first and second magneto-resistive bridge sensors 308 and 310, respectively. The second differential amplifier 316 preferably adjusts the bridge excitation voltage so that the difference between the output voltage of the first magneto-resistive bridge sensor 308 and the output voltage of the second magneto-resistive bridge sensor 310 remains at a constant value, namely, a value that causes the output of the first differential amplifier 314 (Vcomp) to remain substantially equal to the predetermined bias voltage 330. In view thereof, the illustrative signal isolator of FIG. 9 may produce an output signal 360 that is relatively insensitive to changes in sensitivity of the first and second magneto-resistive bridge sensors 308 and 310.

Figure 10:
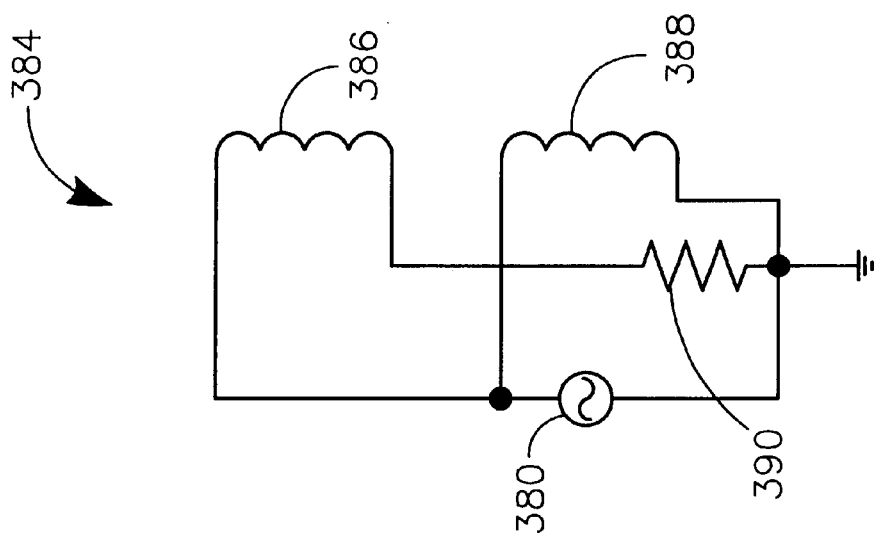
FIG. 10 is a schematic view of an alternative embodiment for generating first and second input magnetic fields at the first and second magneto-resistive bridge sensors of FIG. 9.

FIG. 10 is a schematic view of an alternative embodiment for generating first and second input magnetic fields at the first and second magneto-resistive bridge sensors 308 and 310 of FIG. 9. In this embodiment, the input coil 384 is divided into two parts including a first part 386 and a second part 388. The first part 386 extends adjacent the first magneto-resistive bridge sensor 308, and the second part 388 extends adjacent the second magneto-resistive bridge sensor 310. A resistor 390 is placed in series with the first part 386, but not in series with the second part 388.

The first part 386 and the second part 386 each receive the same input signal from the input signal source 380. However, because the first part 386 has a series resistor 390, the current through the first part 386 is reduced relative to the current through the second part 388. Thus, the first part 386 generates a first input magnetic field adjacent the first magneto-resistive bridge sensor 308 (see FIG. 9), and the second part 388 generates a second input magnetic field adjacent the second magneto-resistive bridge sensor 310.

Figure 11:
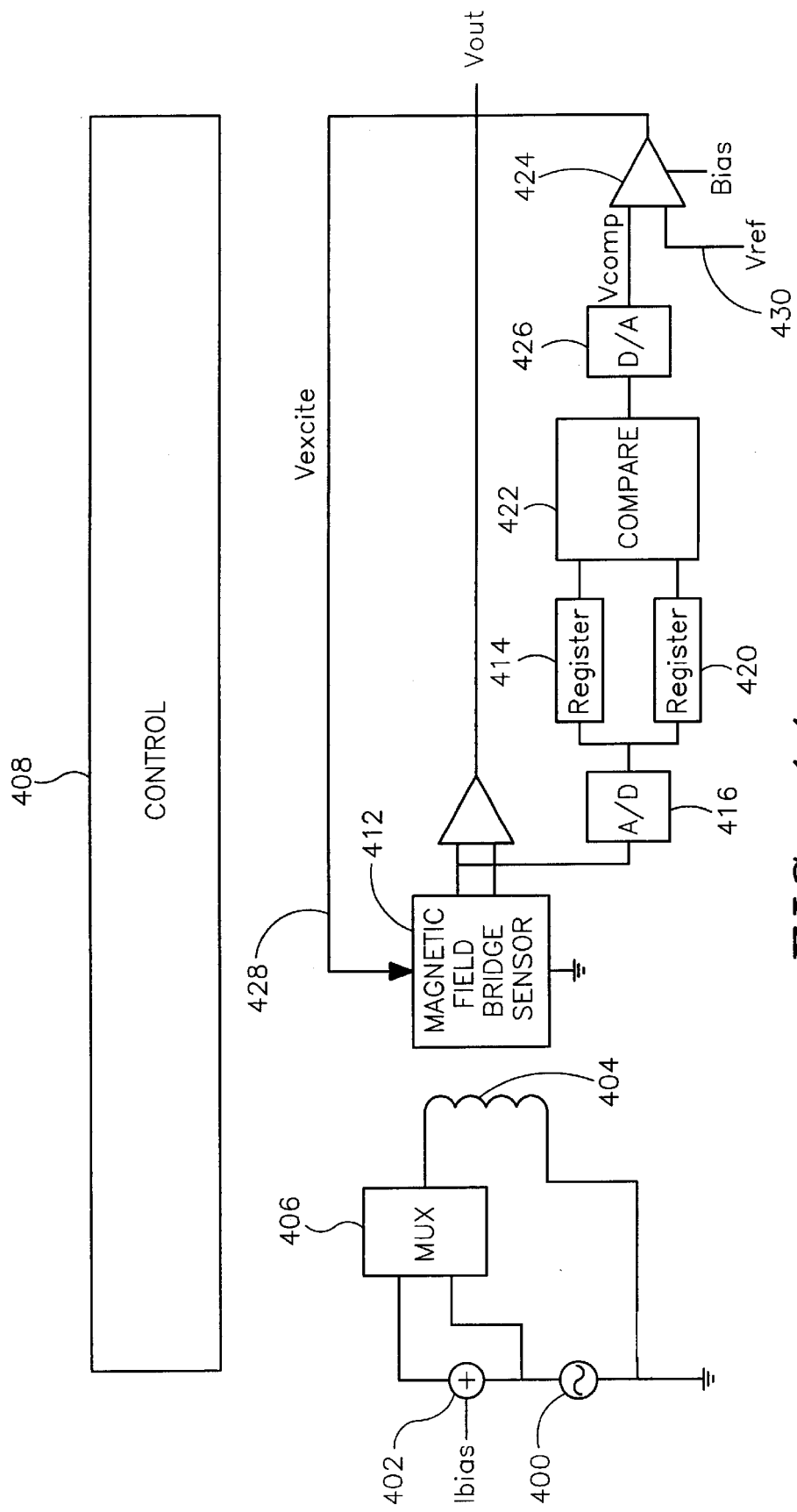
FIG. 11 is a schematic view of an illustrative embodiment similar to that shown in FIG. 9, except a single magneto-resistive bridge sensor is used to perform both measurements of the first and second magneto-resistive bridge sensors of FIG. 9.

Rather than providing two magneto-resistive bridge sensors, it is contemplated that a single magneto-resistive bridge sensor may be used to perform both measurements. One such signal isolator is shown in FIG. 11. In the illustrative embodiment, an input signal source 400 to be measured provides an input signal and a signal adder 402 adds an offset signal to the input signal to provide an offset input signal. The input signal and the offset input signal are preferably sequentially provided to input coil 404 via a multiplexer 406 or the like. The multiplexer 406 is preferably controlled by a controller 408.

During a first cycle, the input signal is first provided to the input coil 404 by properly controlling multiplexer 406. The input signal causes the input coil 404 to generate an input magnetic field at the magneto-resistive bridge sensor 412. The magneto-resistive bridge sensor 412 senses the input magnetic field, and provides a first output signal, which is subsequently stored in register 414. Because the first output signal is typical an analog signal, the first output signal may first be provided to an analog-to-digital converter 416 before being stored in register 414.

During a second cycle, the offset input signal may be provided to the input coil 404 by properly controlling multiplexer 406. The offset input signal causes the input coil 404 to generate an offset input magnetic field at the magneto-resistive bridge sensor 412. Since the offset input signal is different from the input signal, the magneto-resistive bridge sensor 412 will now be operating at a different characteristic point along the applied field versus output voltage curve than when the input signal was provided.

The magneto-resistive bridge sensor 412 senses the offset input magnetic field, and provides a second output signal. The second output signal can be stored in register 420 via analog-to-digital converter 416, or alternatively, may be directly compared to the first output signal by compare block 422. In either case, the compare block 422 provides a compare voltage (Vcomp) to differential amplifier 424 via digital-to-analog converter 426, as shown. The differential amplifier 424 compares the Vcomp voltage to a predetermined reference voltage 430, and adjusts the bridge excitation voltage that is supplied to the excitation voltage terminal 428 of the magneto-resistive bridge sensor 412. The differential amplifier 424 preferably adjusts the bridge excitation voltage so that the difference between the output voltage sensed during the first cycle and the output voltage sensed during the second cycle remains at a constant value, namely, a value that causes the output of the compare block 422 (Vcomp) to remain substantially equal to the predetermined bias voltage 430. It is contemplated, of course, that the input signal and offset input signal may be provided to the input coil in any order. For example, the offset input signal may be provided to the input coil 404 first, followed by the input signal.

Figure 12:
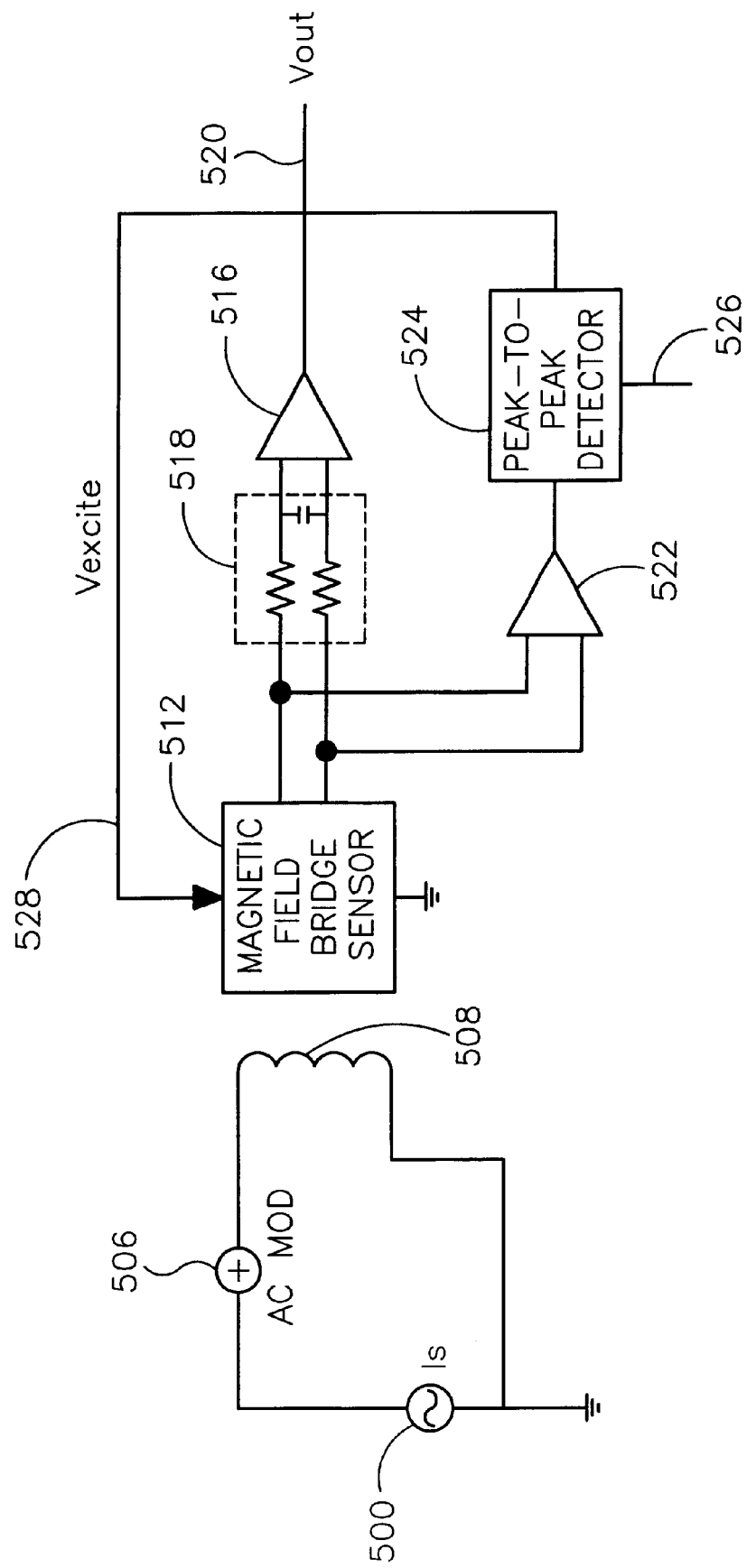
FIG. 12 is a schematic diagram of another illustrative embodiment of the present invention.

FIG. 12 is a schematic diagram of another illustrative embodiment of the present invention. In this illustrative embodiment, an input signal source 500 provides an input signal to be measured, and an AC source 506 provides an AC current signal having a fixed amplitude for modulating the input signal. The frequency of the AC current signal is preferably higher than the expected range of frequencies of the input signal. In one embodiment, the modulated input signal is provided to input coil 508.

The modulated input signal causes the input coil 508 to generate a modulated magnetic field at the magneto-resistive bridge sensor 512. The magneto-resistive bridge sensor 512 senses the modulated magnetic field, and provides a modulated differential output signal. The modulated differential output signal is provided to differential filter 518, which filters out the higher frequency component provided by AC source 506. Accordingly, only the lower frequency component, which is provided by input signal source 500, is provided to the inputs of amplifier 516. Amplifier 516 amplifies the lower frequency component, and provides an output signal $V_{out}$ 520.

To provide compensation, the modulated differential output signal is provided to amplifier 522. Amplifier 522 amplifies the modulated differential output signal, and provides the resulting signal to peak-to-peak detector 524. Peak-to-peak detector 524 detects the peak-to-peak voltage of the resulting modulated differential output signal, and compares the peak-to-peak voltage to a predetermined reference 526. The peak-to-peak detector 528 then adjusts the bridge excitation voltage on terminal 528 of the magneto-resistive bridge sensor 512 until the peak-to-peak voltage of the resulting modulated differential output signal equals the predetermined reference voltage 526. Thus, the bridge excitation voltage is preferably constantly adjusted to compensate for changes in sensitivity of the magneto-resistive bridge sensor 512.

Rather than electrically modulating the input signal and providing the modulated input signal to the input coil 508, it is contemplated that input signal may be magnetically modulated. That is, the AC source 506 may provide an AC current signal to a different input coil (not shown). The magnetic fields produced by the input signal and the AC current signal may then add together at the magneto-resistive bridge sensor 512, which senses the cumulative magnetic field. The remainder of the circuit operates similar to that described above.

Having thus described the preferred embodiments of the present invention, those of skill in the art will readily appreciate that the teachings found herein may be applied to yet other embodiments within the scope of the claims hereto attached.

What is claimed is:

1. An isolator for isolating an input signal from an output signal, comprising:
   an input coil arranged to receive the input signal and to generate an input magnetic field that is related to the input signal;
   a magneto-resistive magnetic field sensor arranged to sense the input magnetic field and to provide a sensor output signal that is related to the input magnetic field;
   an output coil;
   a feedback circuit coupled to the magneto-resistive magnetic field sensor and to the output coil, wherein the feedback circuit is arranged to receive the sensor output signal and to provide a feedback signal to the output coil such that the output coil generates an output magnetic field that at least substantially nulls out the input magnetic field at the magneto-resistive magnetic field sensor; and
   an output signal generator arranged to generate the output signal from the feedback signal, wherein the input coil, the output coil and the magneto-resistive magnetic field sensor are integrated on an integrated circuit having a dielectric between the input coil, the output coil and the magneto-resistive magnetic field sensor.

2. An isolator according to claim 1, wherein the magneto-resistive magnetic field sensor includes at least one magneto-resistive element.

3. An isolator according to claim 1, wherein the magneto-resistive magnetic field sensor includes two resistors coupled together in a half bridge configuration with a half bridge output terminal, at least one of the resistors being a magneto-resistive element.

4. An isolator according to claim 3, wherein the feedback circuit includes an amplifier having a first input terminal coupled to the half bridge output terminal.

5. An isolator according to claim 4, wherein the amplifier has a second input terminal coupled to a first predetermined voltage.

6. An isolator according to claim 5, wherein the output coil has a first terminal and a second terminal, and wherein the amplifier has an output terminal coupled to the first terminal of the output coil.

7. An isolator according to claim 6, wherein the output signal generator includes a resistance interposed between the output terminal of the amplifier and the first terminal of the output coil.

8. An isolator according to claim 7, wherein the second terminal of the output coil is coupled to a second predetermined voltage.

9. An isolator according to claim 8, wherein the second predetermined voltage is ground.

10. An isolator according to claim 8, wherein the second predetermined voltage is above ground.

11. An isolator according to claim 10, wherein the amplifier has a reference terminal for receiving a reference voltage, wherein the amplifier generates a feedback signal that at least substantially equals the reference voltage when the voltage at the first input terminal of the amplifier substantially equals the first predetermined voltage at the second input terminal of the amplifier.

12. An isolator according to claim 11, wherein the reference terminal of the amplifier is coupled to the second predetermined voltage.

13. An isolator according to claim 1 wherein the magneto-resistive magnetic field sensor includes four resistors coupled together in a full bridge configuration with a first bridge output terminal and a second bridge output terminal, at least one of the resistors being a magneto-resistive element.

14. An isolator according to claim 13, wherein the feedback circuit includes an amplifier having a first input terminal coupled to the first bridge output terminal and a second input terminal coupled to the second bridge output terminal.

15. An isolator according to claim 14, wherein the output coil has a first terminal and a second terminal, and wherein the amplifier has an output terminal coupled to the first terminal of the output coil.

16. An isolator according to claim 15, wherein the output signal generator includes a resistance interposed between the output terminal of the amplifier and the first terminal of the output coil.

17. An isolator according to claim 16, wherein the second terminal of the output coil is coupled to a predetermined voltage.

18. An isolator according to claim 17, wherein the predetermined voltage is ground.

19. An isolator according to claim 17, wherein the predetermined voltage is above ground.

20. An isolator according to claim 18, wherein the amplifier has a reference terminal for receiving a reference voltage, wherein the amplifier generates a feedback signal that at least substantially equals the reference voltage when the voltage at the first input terminal of the amplifier substantially equals the voltage at the second input terminal of the amplifier.

21. An isolator according to claim 20, wherein the reference terminal of the amplifier is coupled to the predetermined voltage.

22. An isolator according to claim 1 having no Faraday shield between the input coil and the magneto-resistive magnetic field sensor.

23. An isolator according to claim 1, wherein the input coil is provided adjacent a first major surface of the magneto-resistive magnetic field sensor, and the output coil is provided adjacent a second opposite major surface of the magneto-resistive magnetic field sensor.

24. An isolator according to claim 23, wherein the input coil is separated from the first major surface of the magneto-resistive magnetic field sensor by a first dielectric layer, and the output coil is separated from the second opposite major surface of the magneto-resistive magnetic field sensor by a second dielectric layer.

25. An isolator according to claim 24, wherein the input coil is formed using one layer of metal and the output coil is formed using a different layer of metal.

26. An isolator for isolating an input signal from an output signal comprising:

an input coil arranged to receive the input signal and to generate an input magnetic field that is related to the input signal;

a magneto-resistive magnetic field sensor having at least four resistors coupled together in a full bridge configuration with a first bridge output terminal and a second bridge output terminal, at least one of the resistors being a magneto-resistive element, the magneto-resistive magnetic field sensor being arranged to sense the input magnetic field and to provide a sensor output signal on the first and second bridge output terminals that is related to the input magnetic field;

an output coil having a first terminal and a second terminal, wherein the input coil, the output coil and the magneto-resistive magnetic field sensor are integrated on an integrated circuit having a dielectric between the input coil, the output coil and the magneto-resistive magnetic field sensor;

a differential amplifier having a first input terminal, a second input terminal and an output terminal, the first input terminal and the second input terminal being coupled to the first and second bridge output terminals, respectively, so as to receive the sensor output signal from the magneto-resistive magnetic field sensor, the differential amplifier providing a feedback signal to the first terminal of the output coil that is related to the sensor output signal such that the output coil generates an output magnetic field that at least substantially nulls out the input magnetic field at the magneto-resistive magnetic field sensor; and an output signal generator arranged to generate the output signal from the feedback signal.

27. An isolator according to claim 26, wherein the output signal generator includes a resistance interposed between the output terminal of the amplifier and the first terminal of the output coil.

28. An isolator according to claim 26, wherein the second terminal of the output coil is coupled to a predetermined voltage.

29. An isolator according to claim 28, wherein the predetermined voltage is ground.

30. An isolator according to claim 28, wherein the predetermined voltage is above ground.

31. An isolator according to claim 30, wherein the amplifier has a reference terminal for receiving a reference voltage, wherein the amplifier generates a feedback signal that at least substantially equals the reference voltage when the voltage at the first input terminal of the amplifier substantially equals the voltage at the second input terminal of the amplifier.

32. An isolator according to claim 31, wherein the reference terminal of the amplifier is coupled to the predetermined voltage.

33. An isolator according to claim 26 having no Faraday shield between the input coil and the magneto-resistive magnetic field sensor.

34. An isolator for isolating an input signal from an output signal, comprising:

a first magneto-resistive bridge sensor having an excitation voltage terminal and an output terminal, the first magneto-resistive bridge receiving an excitation voltage via the excitation voltage terminal and providing an output voltage via the output terminal;

a second magneto-resistive bridge sensor having an excitation voltage terminal and an output terminal, the second magneto-resistive bridge receiving an excitation voltage via the excitation voltage terminal and providing an output voltage on the output terminal;

first input magnetic field generating means for receiving the input signal and for generating a first input magnetic field adjacent the first magneto-resistive bridge sensor, the first input magnetic field being related the input signal;

offset signal generating means for generating an offset signal;

second input magnetic field generating means for adding the input signal and the offset signal, and for generating a second input magnetic field adjacent the second magneto-resistive bridge sensor that is related to the input signal but offset therefrom; and compensating means coupled to the output terminals of the first and second magneto-resistive bridge sensors for providing a compensated excitation voltage to the excitation voltage terminals of the first and second magneto-resistive bridge sensors, the compensated excitation voltage being a function of the difference between the output voltage of the first magneto-resistive bridge sensor and the output voltage of the second magneto-resistive bridge sensor.

35. An isolator according to claim 34, wherein the compensating means provides a compensated excitation voltage to the excitation voltage terminals of the first and second magneto-resistive bridge sensors such that the difference between the output voltage of the first magneto-resistive bridge sensor and the output voltage of the second magneto-resistive bridge sensor is at a predetermined value.

36. A method for isolating an input signal from an output signal using a first magneto-resistive bridge sensor and a second magneto-resistive bridge sensor, the method comprising the steps of;

providing a first input magnetic field adjacent the first magneto-resistive bridge sensor, the first input magnetic field being related to the input signal;

providing a second input magnetic field adjacent the second magneto-resistive bridge, the second input magnetic field being related to the input signal but offset therefrom;

sensing the first input magnetic field via the first magneto-resistive bridge sensor, and providing a first output signal;

sensing the second input magnetic field via the second magneto-resistive bridge sensor, and providing a second output signal; and changing the bias voltage provided to the first magneto-resistive bridge sensor and the second magneto-resistive bridge sensor so that the difference between the first output signal and the second output signal is at a predetermined value.

37. A method according to claim 36, further comprising the step of adding an offset signal to the input signal thereby resulting in an offset input signal, whereby the second input magnetic field is related to the offset input signal.

38. An isolator for isolating an input signal from an output signal, comprising: first input magnetic field generating means for receiving the input signal and for generating a first input magnetic field that is related the input signal;

offset signal generating means for generating an offset input signal, wherein the offset input signal is related to the input signal but offset therefrom;

second input magnetic field generating means for generating a second input magnetic field that is related to the offset input signal;

a magneto-resistive bridge sensor having an excitation voltage terminal and an output terminal, the magneto-resistive bridge receiving an excitation voltage via the excitation voltage terminal and providing an output voltage on the output terminal;

first storing means coupled to the magneto-resistive bridge sensor; compensating means coupled to the first storing means for providing an updated compensated excitation voltage to the excitation voltage terminal of the magneto-resistive bridge sensor; and controller means for controlling the first input magnetic field generating means, the second input magnetic field generating means, and the first storing means, the controller means first allowing one of the first input magnetic field generating means and second input magnetic field generating means to generate the first input magnetic field or second input magnetic field adjacent the magneto-resistive bridge sensor, the magneto-resistive bridge then sensing the first input magnetic field or the second input magnetic field and providing a first output voltage that is related to the first input magnetic field or the second input magnetic field, the controller means then allowing the first storing means to store a value that is related to the first output voltage, the controller means then allowing the other input magnetic field generating means to generate an input magnetic field adjacent the magneto-resistive bridge sensor, the magneto-resistive bridge sensor then sensing the other input magnetic field and providing a second output voltage, the controller means then allowing the compensating means to provide the updated compensated excitation voltage to the excitation voltage terminal of the magneto-resistive bridge sensor, the compensated excitation voltage being a function of the difference between the first output voltage and the second output voltage of the magneto-resistive bridge sensor.

39. An isolator according to claim 38, further comprising:

second storing means coupled to the magneto-resistive bridge sensor; and the controller means allowing the second storing means to store a value that is related to the other output voltage.

40. A method for isolating an input signal from an output signal using a magneto-resistive bridge sensor, the method comprising the steps of;

providing a first input magnetic field adjacent the magneto-resistive bridge sensor, the first input magnetic field being related to the input signal;

sensing the first input magnetic field via the magneto-resistive bridge sensor, and providing a first output signal that is related to the first input magnetic field;

storing a value that is related to the first output signal;

providing a second input magnetic field adjacent the magneto-resistive bridge sensor, the second input magnetic field being related to the input signal but offset therefrom;

sensing the second input magnetic field via the magneto-resistive bridge sensor, and providing a second output signal that is related to the second input magnetic field; and changing the bias voltage provided to the magneto-resistive bridge sensor so that the difference between the first output signal and the second output signal is at a predetermined value.

41. A method according to claim 40, further comprising the step of adding an offset signal to the input signal thereby resulting in an offset input signal, whereby the second input magnetic field is related to the offset input signal.

42. A method according to claim 40, further comprising the step of storing a value that is related to the second output signal.

43. A method for isolating an input signal from an output signal using a magneto-resistive bridge sensor, the method comprising the steps of:

providing a first input magnetic field adjacent the magneto-resistive bridge sensor, the first input magnetic field being related to the input signal but offset therefrom;

sensing the first input magnetic field via the magneto-resistive bridge sensor, and providing a first output signal that is related to the first input magnetic field;

storing a value that is related to the first output signal;

providing a second input magnetic field adjacent the magneto-resistive bridge sensor, the second input magnetic field being related to the input signal;

sensing the second input magnetic field via the magneto-resistive bridge sensor, and providing a second output signal that is related to the second input magnetic field; and changing the bias voltage provided to the magneto-resistive bridge sensor so that the difference between the first output signal and the second output signal is at a predetermined value.

44. A method according to claim 43, further comprising the step of adding an offset signal to the input signal thereby resulting in an offset input signal, whereby the first input magnetic field is related to the offset input signal.

45. A method according to claim 43, further comprising the step of storing a value that is related to the second output signal.

46. A method according to claim 45, further comprising the step of converting the first output signal to a digital signal via an analog-to-digital converter before storing the first out put signal.

47. A method according to claim 46, further comprising the step of converting the second output signal to a digital signal via an analog-to-digital converter before storing the second output signal.

48. An isolator for isolating an input signal from an output signal, comprising:

an AC modulation block for modulating the input signal with an AC signal, thereby providing a modulated input signal;

input magnetic field generating means for receiving the modulated input signal and for generating a modulated input magnetic field that is related the modulated input signal;

a magneto-resistive bridge sensor having an excitation voltage terminal and an output terminal, the magneto-resistive bridge sensor receiving an excitation voltage via the excitation voltage terminal and providing an output signal on the output terminal;

filter means coupled to the output terminal of the magneto-resistive bridge sensor for filtering out selected frequency components from the output signal of the magneto-resistive bridge sensor thereby resulting in the output signal of the isolator;

peak-to-peak detector means for detecting the peak-to-peak voltage of the output signal of the magneto-resistive bridge sensor, and for comparing the detected peak-to-peak voltage with a predetermined reference; and excitation adjustment means for adjusting the excitation voltage that is provided to the excitation voltage terminal of the magneto-resistive bridge sensor until the peak-to-peak voltage equals the predetermined reference.

49. An isolator for isolating an input signal from an output signal, comprising:

first input magnetic field generating means for receiving the input signal and for generating an input magnetic field that is related the input signal;

an AC modulation block for providing an AC modulation signal; second input magnetic field generating means for receiving the AC modulation signal and for generating a modulated magnetic field that is related the AC modulation signal;

a magneto-resistive bridge sensor having an excitation voltage terminal and an output terminal, the magneto-resistive bridge sensor receiving an excitation voltage via the excitation voltage terminal and providing an output signal on the output terminal, the magneto-resistive bridge sensor receiving both the input magnetic field and the modulated magnetic field;

filter means coupled to the output terminal of the magneto-resistive bridge sensor for filtering out selected frequency components from the output signal of the magneto-resistive bridge sensor thereby resulting in the output signal of the isolator;

peak-to-peak detector means for detecting the peak-to-peak voltage of the output signal of the magneto-resistive bridge sensor, and for comparing the detected peak-to-peak voltage with a predetermined reference; and excitation adjustment means for adjusting the excitation voltage that is provided to the excitation voltage terminal of the magneto-resistive bridge sensor until the peak-to-peak voltage equals the predetermined reference.

50. A method for isolating an input signal from an output signal, the method comprising:

providing an input magnetic field through use of an input coil integrated on an integrated circuit, wherein the input magnetic field is related to the input signal;

sensing the input magnetic field using a magneto-resistive magnetic field sensor integrated on the integrated circuit and separated from the input coil by a first dielectric;

providing an output magnetic field through use of an output coil integrated on the integrated circuit and separated from the magneto-resistive magnetic field sensor by a second dielectric, wherein the output magnetic field at least substantially nulls out the input magnetic field;

providing an output signal that is related to the output magnetic field.

* * * * *